(12) United States Patent
Jaeschke et al.

(10) Patent No.: US 12,155,393 B2
(45) Date of Patent: Nov. 26, 2024

(54) REFERENCE OSCILLATOR ARRANGEMENT, RADAR SYSTEM AND SYNCHRONIZATION METHOD

(71) Applicant: 2pi-Labs GmbH, Bochum (DE)

(72) Inventors: Timo Jaeschke, Hattingen (DE); Simon Kueppers, Bochum (DE)

(73) Assignee: 2pi-Labs GmbH, Bochum (DE)

( * ) Notice: Subject to any disclaimer, the term of this patent is extended or adjusted under 35 U.S.C. 154(b) by 499 days.

(21) Appl. No.: 17/310,230

(22) PCT Filed: Feb. 19, 2021

(86) PCT No.: PCT/EP2021/054132
§ 371 (c)(1),
(2) Date: Jul. 27, 2021

(87) PCT Pub. No.: WO2021/165459
PCT Pub. Date: Aug. 26, 2021

(65) Prior Publication Data
US 2022/0278688 A1     Sep. 1, 2022

(30) Foreign Application Priority Data

Feb. 20, 2020  (EP) ..................................... 20158599
Aug. 24, 2020  (EP) ..................................... 20192395

(51) Int. Cl.
*H03L 7/099*     (2006.01)
*G01S 7/35*      (2006.01)
(Continued)

(52) U.S. Cl.
CPC .............. *H03L 7/099* (2013.01); *G01S 7/352* (2013.01); *G01S 7/4021* (2013.01); *G01S 13/34* (2013.01); *H03B 5/32* (2013.01)

(58) Field of Classification Search
CPC ....... H03L 7/099; G01S 7/352; G01S 7/4021; G01S 13/34; H03B 5/32
(Continued)

(56) References Cited

U.S. PATENT DOCUMENTS 2,987,680 A * 6/1961  Israel ..................... H03L 7/22
                                          331/22
3,030,582 A * 4/1962  Holcomb ............... G01S 13/66
                                          327/344
(Continued)

FOREIGN PATENT DOCUMENTS

DE    102004030841 A1 * 1/2006  .............. G01S 7/35
DE    102018206701 A1 * 11/2019 ............. G01R 29/26
(Continued)

OTHER PUBLICATIONS

International Preliminary Report on Patentability for International Application No. PCT/EP2021/054132, mailed Sep. 1, 2022.
(Continued)

*Primary Examiner* — Nuzhat Pervin
(74) *Attorney, Agent, or Firm* — Jason H. Vick; Womble Bond Dickinson (US) LLP

(57) ABSTRACT

The present invention relates to a reference oscillator arrangement comprising a first reference oscillator for generating a first output signal and a second reference oscillator for generating a second output signal, wherein the reference oscillator arrangement comprises a phase locked loop for controlling the frequency and/or phase of the second reference oscillator to the frequency and/or phase of the first reference oscillator.

18 Claims, 4 Drawing Sheets

Figure 1:
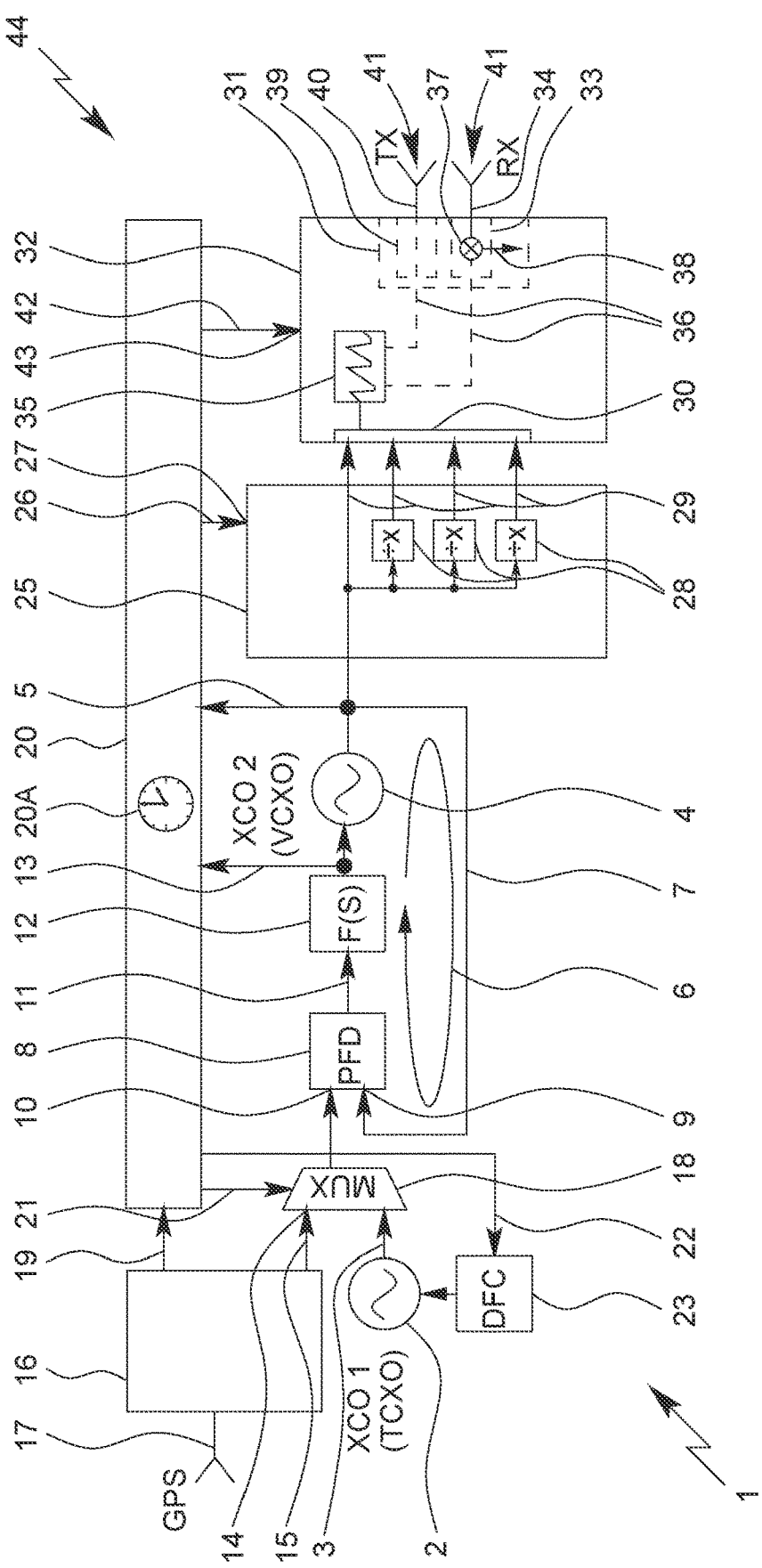

(51) Int. Cl.
  *G01S 7/40* (2006.01)
  *G01S 13/34* (2006.01)
  *H03B 5/32* (2006.01)

(58) Field of Classification Search
  USPC .......................................................... 342/174
  See application file for complete search history.

(56) References Cited

U.S. PATENT DOCUMENTS

| | | | | |
|---|---|---|---|---|
| 3,177,442 A * | 4/1965 | Halverson | ................ | H03L 7/20 324/76.83 |
| 3,177,444 A * | 4/1965 | Foot | ................ | H03L 7/20 331/25 |
| 3,191,129 A * | 6/1965 | Feldman | ................ | H03C 3/09 331/14 |
| 3,202,936 A * | 8/1965 | Kaminski | ................ | H03L 7/16 331/11 |
| 3,241,084 A * | 3/1966 | Klingberg | ................ | H03L 7/113 331/8 |
| 3,337,813 A * | 8/1967 | Graeve | ................ | H03L 7/093 331/25 |
| 3,365,676 A * | 1/1968 | Buss | ................ | H03L 7/22 331/22 |
| 3,435,367 A * | 3/1969 | Little, Jr. | ................ | H03L 7/23 331/22 |
| 3,546,617 A * | 12/1970 | Westwood | ................ | H03L 7/23 331/11 |
| 3,562,661 A * | 2/1971 | Crumb et al. | ................ | H04L 7/0331 331/25 |
| 4,318,055 A * | 3/1982 | Hopwood | ................ | H03L 7/08 331/25 |
| 5,345,186 A * | 9/1994 | Lesmeister | ................ | H03K 5/15 331/25 |
| 6,147,560 A * | 11/2000 | Erhage | ................ | H03L 7/02 329/307 |
| 6,768,362 B1 * | 7/2004 | Mann | ................ | H03L 7/099 327/147 |
| 7,587,184 B2 * | 9/2009 | Der | ................ | H03J 1/0008 331/34 |
| 7,589,595 B2 * | 9/2009 | Cutler | ................ | H04J 3/0697 331/158 |
| 7,701,299 B2 * | 4/2010 | Chenakin | ................ | H03L 7/185 331/25 |
| 7,804,369 B2 * | 9/2010 | Saunders | ................ | G01S 7/35 331/25 |
| 8,306,491 B2 * | 11/2012 | Der | ................ | H03J 1/0008 331/34 |
| 8,432,200 B1 * | 4/2013 | Thakur | ................ | H03L 7/0893 327/147 |
| 8,497,717 B2 * | 7/2013 | Miyahara | ................ | H03L 7/14 327/147 |
| 8,791,734 B1 * | 7/2014 | Hara | ................ | H03L 7/146 327/158 |
| 9,103,915 B2 * | 8/2015 | Simic | ................ | H04B 7/216 |
| 9,281,822 B2 * | 3/2016 | Yorita | ................ | H03L 7/104 |
| 9,503,109 B2 * | 11/2016 | McLaurin | ................ | H03L 7/104 |
| 10,483,990 B2 * | 11/2019 | Xiu | ................ | H03L 7/085 |
| 10,491,225 B2 * | 11/2019 | Niwa | ................ | H03B 5/36 |
| 10,911,050 B2 * | 2/2021 | Oja | ................ | H03B 5/32 |
| 2005/0184822 A1 * | 8/2005 | Mattila | ................ | H03H 9/02244 331/175 |
| 2006/0164173 A1 * | 7/2006 | Klein | ................ | G01S 7/4008 331/16 |
| 2008/0100350 A1 * | 5/2008 | Pernia | ................ | H03B 5/1243 331/181 |
| 2009/0140819 A1 * | 6/2009 | Rogers | ................ | H03B 5/32 331/46 |
| 2011/0212718 A1 * | 9/2011 | Schoepf | ................ | G01S 19/235 342/357.29 |
| 2012/0163134 A1 * | 6/2012 | Schoepf | ................ | H03L 7/16 368/200 |
| 2015/0372644 A1 * | 12/2015 | Boos | ................ | H03C 5/00 331/46 |
| 2016/0018511 A1 * | 1/2016 | Nayyar | ................ | G01S 13/931 342/27 |
| 2016/0126964 A1 * | 5/2016 | Huang | ................ | H03L 7/1974 327/156 |
| 2016/0285465 A1 * | 9/2016 | Abe | ................ | H03B 5/1212 |
| 2017/0026049 A1 * | 1/2017 | Sundström | ................ | H03B 5/32 |
| 2017/0090014 A1 * | 3/2017 | Subburaj | ................ | G01S 7/4004 |
| 2017/0310278 A1 * | 10/2017 | Sachs | ................ | H03L 7/14 |
| 2018/0136323 A1 * | 5/2018 | Pozdniakov | ................ | G01S 7/4008 |
| 2018/0159647 A1 * | 6/2018 | Nayyar | ................ | H04L 12/40 |
| 2019/0020361 A1 * | 1/2019 | Tong | ................ | H03L 7/24 |
| 2020/0118073 A1 * | 4/2020 | Phillips | ................ | G06Q 20/065 |
| 2020/0220549 A1 * | 7/2020 | Oja | ................ | H03B 5/04 |
| 2021/0072349 A1 * | 3/2021 | Mayer | ................ | G01S 7/4017 |

FOREIGN PATENT DOCUMENTS

| | | | | |
|---|---|---|---|---|
| EP | 1233520 A2 * | 8/2002 | ................ | G01K 7/32 |
| EP | 1901431 B1 * | 3/2011 | ................ | G01S 13/34 |
| EP | 2293096 A2 * | 9/2011 | ................ | G01S 7/288 |
| EP | 3818635 B1 * | 3/2023 | ................ | H03B 5/32 |
| WO | WO-2006000611 A1 * | 1/2006 | ................ | G01K 7/32 |
| WO | WO-2019018042 A1 * | 1/2019 | ................ | G01S 13/003 |

OTHER PUBLICATIONS

International Search Report for International Application No. PCT/EP2021/054132, mailed Jul. 8, 2021.
Written Opinion for International Application No. PCT/EP2021/054132, mailed Jul. 8, 2021.

* cited by examiner

REFERENCE OSCILLATOR ARRANGEMENT, RADAR SYSTEM AND SYNCHRONIZATION METHOD

CROSS-REFERENCE TO RELATED APPLICATIONS

This application is a national stage application under 35 U.S.C. 371 of PCT Application No. PCT/EP2021/054132 having an international filing date of 19 Feb. 2021, which designated the United States, which PCT application claimed the benefit of European Application No. 20158599.9, filed 20 Feb. 2020 and European Application No. 20192395.0, filed 24 Aug. 2020, each of which are incorporated herein by reference in their entirety.

The present invention relates generally to oscillators for generating an alternating electrical signal. More particularly, the present invention relates to a reference oscillator arrangement including a reference oscillator, a radar system therewith, and a synchronization method.

Oscillators in the sense of the present invention are preferably electronically realized devices for generating a preferably at least substantially periodic and/or mono-frequency electrical alternating signal as an output signal, in particular an alternating voltage and/or an alternating current.

Reference oscillators in the sense of the present invention are preferably those oscillators which are characterized by a particularly high accuracy and/or stability of the output signal or its frequency and/or phase, in particular also in free-running mode. For this purpose, reference oscillators can have a frequency reference element for generating a short- and/or long-term stable oscillation of the reference oscillator. A frequency reference element is preferably a device for generating an oscillating circuit with high electrical quality, an oscillating circuit with low dependence on external boundary conditions such as temperature, and/or an oscillating circuit with a low change in oscillating properties due to aging or the like.

Particularly preferably, reference oscillators in the sense of the present invention are quartz oscillators, also called quartz-stabilized oscillators. Quartz oscillators have an oscillating crystal (as a frequency reference element). The oscillating crystal is preferably used as a frequency-determining component, in particular for forming an oscillating circuit of the quartz oscillator with the oscillating crystal for generating the oscillation frequency of the reference oscillator or the frequency of its output signal.

Crystal oscillators are usually designated by the abbreviation XO (for Crystal Oscillator). Variants of crystal oscillators which can be reference oscillators in the sense of the present invention or form a part thereof are preferably crystal oscillators which can be tuned in their oscillation frequency or the frequency of their output signal (VXO—Variable Crystal Oscillator), crystal oscillators which can be tuned by an electrical voltage (VCXO—Voltage Controlled Crystal Oscillator), temperature compensated crystal (stabilized against temperature drift of the oscillation frequency or the frequency of their output signal) oscillators (TCXO—Temperature Compensated Crystal Oscillator), temperature compensated tunable crystal oscillators (TCCXO—Temperature Compensated Controlled Crystal Oscillator), temperature compensated voltage controlled crystal oscillators (TCVCXO—Temperature Compensated Voltage Controlled Crystal Oscillator) and other oscillators stabilized by a crystal.

For the purposes of the present invention, reference oscillators also preferably include so-called oven controlled crystal oscillators (OCXO—Oven Controlled Crystal Oscillator), in particular tunable oven controlled crystal oscillators (OCVCXO—Oven Controlled Voltage Controlled Crystal Oscillator). These are temperature-compensated in that they are regulated to a specific, predefined operating temperature by means of a heater.

However, due to the complex construction, the associated manufacturing effort and high material input, as well as the high current consumption of oven quartz oscillators caused by the heating, it is preferred that reference oscillators in the sense of the present invention are not or do not have oven quartz oscillators or are realized without heating.

In principle, the present invention relates to a reference oscillator arrangement as used for generating an output signal as a clock. Quite preferably, a reference oscillator arrangement is suitable for generating a clock for high frequency systems, in particular in the millimeter wave range or between 30 GHz and 1 THz. In principle, however, other frequencies and output signals can be generated or can be generated for applications other than use as a clock. A frequency of the output signal of the reference oscillator arrangement may have a frequency different from the final clock, from which the clock is or can be derived.

U.S. Pat. No. 10,491,225 B2 relates to a reference oscillator arrangement in which a reference oscillator forms the input signal of a phase locked loop (PLL), which in turn synchronizes a voltage-controlled oscillator with the reference oscillator.

The VCO (Voltage Controlled Oscillator) is a classic, crystal-free oscillator based on an electrical circuit that allows the oscillation frequency to be changed via a control voltage.

The phase-locked loop is set up to match the output signal of the voltage-controlled oscillator, in this case the output signal divided by a factor N, with the reference oscillator signal and in this way to control the control voltage of the voltage-controlled oscillator. The phase-locked loop is therefore a control loop for controlling the voltage-controlled oscillator. The feedback of the output signal of the voltage-controlled oscillator divided by the factor N to the input of the phase-locked loop leads to the formation of an output frequency of the voltage-controlled oscillator which corresponds to N times the output frequency of the reference oscillator signal.

The phase-locked loop disciplines the characteristics of the reference oscillator on the voltage-controlled oscillator within its loop bandwidth, so that control of the voltage-controlled oscillator by the phase-locked loop based on the output signal of the reference oscillator improves the characteristics of the voltage-controlled oscillator or stabilizes it.

U.S. Pat. No. 9,281,822 B2 relates to a reference oscillator arrangement in the form of an oven quartz oscillator which is designed to compensate for a drift caused by the oven quartz oscillator in the heating phase. For this purpose, the oven quartz oscillator has a voltage-controlled quartz oscillator which is temperature-compensated in a controlled manner via a phase-locked loop, thus forming a temperature-compensated quartz oscillator. This function is used to provide an output signal compensated for temperature drift until a heating device has brought the arrangement to its nominal temperature, and henceforth it operates as a classical oven quartz oscillator. Apart from the earlier availability of an output signal, this solution still results in high current consumption and high material usage.

Against this background, it is the task of the present invention to specify a reference oscillator arrangement, a radar system or a synchronization method, whereby an output signal of high quality, in particular with high frequency stability and/or low phase noise, can be achieved with low power dissipation and/or with rapid availability of a stable output signal after activation.

The present task is solved by a reference oscillator arrangement according to claim 1, a radar system according to claim 12 or a synchronization method according to claim 15. Advantageous further embodiments are the subject of the subclaims.

The reference oscillator arrangement according to the proposal, preferably for a radar system or radar applications, has a first reference oscillator for generating a first output signal and a second reference oscillator, preferably different from the first, for generating a second output signal.

Furthermore, the reference oscillator arrangement according to the proposal has a phase-locked loop for controlling the frequency and/or phase of the second reference oscillator to the frequency and/or phase of the first reference oscillator. In other words, the phase-locked loop controls or is designed to control the frequency of the second reference oscillator to the frequency of the first reference oscillator frequency and/or the phase of the second reference oscillator to the phase of the first reference oscillator.

In other words, the reference oscillator arrangement has a phase-locked loop which, on the basis of the first output signal of the first reference oscillator, regulates the second reference oscillator, which is preferably different from the first, so that the second reference oscillator generates the second output signal which, as a result, is (partly) characterized by the properties of the first reference oscillator via the regulation by means of the phase-locked loop.

Usually, no reference oscillator is used in a phase-locked loop because the output signal of the oscillator controlled by the phase-locked loop is shaped by the control from a reference oscillator coupled to a reference input of the phase-locked loop, so that the use of another reference oscillator in the phase-locked loop does not seem worthwhile.

However, it has been shown in a surprising way that disciplining the second reference oscillator by means of the phase-locked loop to the first reference oscillator leads to the fact that positive properties of both reference oscillators can be combined, so that this combination can replace an oven quartz oscillator with regard to the stability of the frequency, a low jitter and/or a low phase noise. At the same time, the second output signal is available much earlier with sufficient stability compared to an output signal of an oven crystal oscillator, since the lengthy heating phase of the oven crystal is omitted, and the material input as well as the current consumption are lower in comparison.

The first reference oscillator preferably exhibits better frequency stability in free-running mode than the second reference oscillator. Alternatively or additionally, the second reference oscillator in free-running mode preferably exhibits lower (carrier-far) phase noise than the first reference oscillator.

Preferably, at least the second reference oscillator is controllable, in particular a voltage-controlled reference oscillator (VCXO). This allows it to be controlled with a control variable of the phase-locked loop and in particular to be disciplined to the first reference oscillator.

Due to the synchronization of two preferably different reference oscillators, the reference oscillator arrangement according to the proposal preferably makes it possible to combine (advantageous) characteristics of both reference oscillators, in particular by imposing an (advantageous) characteristic such as a (better) frequency stability of the first reference oscillator on the second reference oscillator, while the second reference oscillator at least substantially retains strengths in other characteristics, such as a lower—in particular carrier-far phase noise compared to the first reference oscillator.

In another aspect, which may also be implemented independently, the present invention relates to a radar system having a plurality of reference oscillator arrangements, at least one reference oscillator arrangement of which satisfies the features described above.

Further, the radar system according to the proposal comprises a clock synchronization device for synchronizing clocks of the reference oscillator arrangements. This enables the reference oscillator arrangements of the radar system to provide output signals that are synchronized with one another, in particular frequency-synchronous and/or phase-synchronous output signals.

The reference oscillator arrangements of the radar system may form radar modules, radar transmitters and/or radar receivers or a part thereof. In particular, the reference oscillator arrays may be provided for operating different radar receivers that are or may be located at different locations.

Based on the same transmitted signal, the radar receivers at the different locations can then receive received signals based on a reflection of the same transmitted signal, and additional information based on the spatial distribution of the radar receivers can be determined by deviating the received signals from each other.

Here it is not necessary, although possible, that several transmitters assigned to the respective reference oscillator arrangements are used for transmitting radar signals. This is because the synchronization of the reference oscillator arrangements makes it possible to evaluate received signals even in the case where a received signal is not based on a transmitted signal from the same radar module.

Another aspect of the present invention, which can also be implemented independently, relates to a synchronization method for radar systems in which a plurality of reference oscillator arrays are synchronized with each other.

The reference oscillator arrangements each have a first reference oscillator and a second reference oscillator. The frequency and/or phase of the second reference oscillator can be controlled to the frequency and/or phase of the first reference oscillator by a phase locked loop. By this, the second reference oscillator can be disciplined to the first reference oscillator. In particular, the second reference oscillator (close to the carrier) can be controlled to the frequency and/or phase of the first reference oscillator.

It is further provided that the frequency and/or phase of the first reference oscillator is calibrated on the basis of a calibration signal, in particular on its frequency and/or phase.

For example, using a satellite navigation signal, radio timing signal, and/or network synchronization signal as the calibration signal or to form the calibration signal can enable calibration of the frequency and/or phase of the first reference oscillator.

The calibration of the first reference oscillator makes it possible in the following, in particular due to the control of the second reference oscillator via the phase-locked loop to the frequency and/or phase of the first reference oscillator, to generate a frequency and/or phase synchronous second output signal by reference oscillator arrangements or radar modules and/or radar receivers provided or arrangeable at different locations.

Alternatively or additionally, the frequency and/or phase of the second reference oscillator can be (permanently) controlled to match the phase and/or frequency of a calibration signal or an (external) calibration signal source and/or the second reference oscillator or phase control loop can be (permanently) fed with the calibration signal. In this case, the first reference oscillator is preferably not used. Preferably, this makes it possible to operate several reference oscillator arrangements or systems with it, preferably as a compound, phase-locked together or to each other.

Another aspect of the present invention, which can also be implemented independently, relates to a calibration method for calibrating a first reference oscillator, wherein the frequency and/or phase of a second reference oscillator can be controlled with a phase-locked loop to the frequency and/or phase of either the first reference oscillator or a calibration signal.

In the calibration method, the second reference oscillator is controlled by the phase-locked loop such that its frequency and/or phase alternately at least substantially coincide with the frequency and/or phase of the first reference oscillator and with the frequency and/or phase of the calibration signal, wherein a control quantity of the phase-locked loop is determined with the calibration signal coupled to the phase-locked loop and the first reference oscillator is tuned such that the control quantity with the first reference oscillator coupled to the phase-locked loop corresponds at least substantially to the control quantity with the calibration signal coupled to the phase-locked loop.

Particularly preferably, the control variable is a control voltage or tuning voltage of the second reference oscillator, in particular for controlling and/or tuning the second reference oscillator.

Preferably, the calibration method according to the proposal indirectly calibrates the frequency and/or phase of the first reference oscillator to that of the calibration signal via the control variable.

The invention enables the traceability of the radar range measurement or the characteristics of the second reference oscillator to the first reference oscillator. The first reference oscillator functions here as a frequency standard for the second reference oscillator.

The first reference oscillator is preferably very stable or exhibits low fluctuations and/or a low drift of the oscillation it generates, its frequency, its phase, its (phase) noise properties or other properties determining the quality of the oscillation, in particular as a function of external conditions such as temperature or aging.

The traceability of the radar range measurement to the first reference oscillator thereby enables a highly precise radar range measurement.

The invention preferably allows interval calibrations of the system. Here, the first reference oscillator can be synchronized with a calibration signal as reference signal or external frequency standard. This is preferably not done permanently, but only phase-wise. Here, the first reference oscillator is synchronized in a first phase of an interval, while it runs freely in a second phase of the interval. Preferably, this is followed by a further corresponding interval. In this way, the first reference oscillator or the system can be repeatedly calibrated with the calibration signal.

The invention enables the distance measurement (or its jitter and/or absolute accuracy) with the method and/or system according to the proposal—preferably by the FMCW principle and/or a preferably synchronously resettable divider chain—to be fed back to the stability of the first reference oscillator or reference crystal control loop (i.e. its jitter or corresponding phase noise and/or absolute frequency accuracy).

The invention enables high-precision radar measurement systems with very good jitter, which is advantageously determined essentially by the phase noise of the second reference oscillator, and outstanding absolute measurement accuracy, in particular due to the long-term stability and temperature compensation of the first reference oscillator. The possibility to calibrate the system completely and to perform calibrated distance measurements is given by the possibility to adjust the preferably long-term stable first reference oscillator with a calibration or reference signal, preferably an external, high-precision and calibrated frequency standard.

Further aspects, advantages and features of the present invention will be apparent from the claims and from the following description of preferred embodiments with reference to the drawing.

Figure 2:
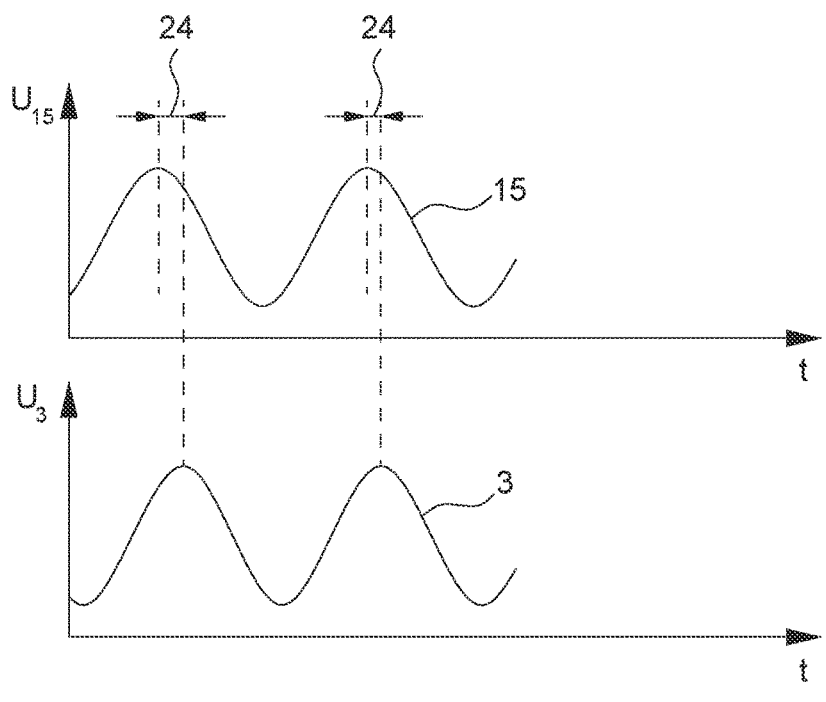
Figure 3A:
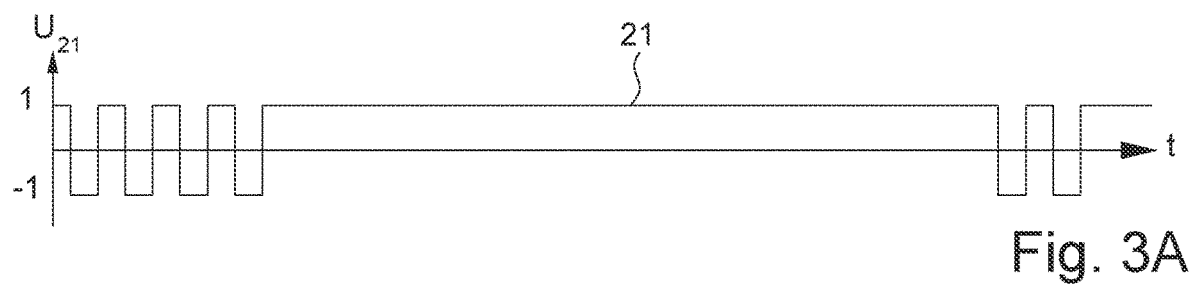
Figure 3B:
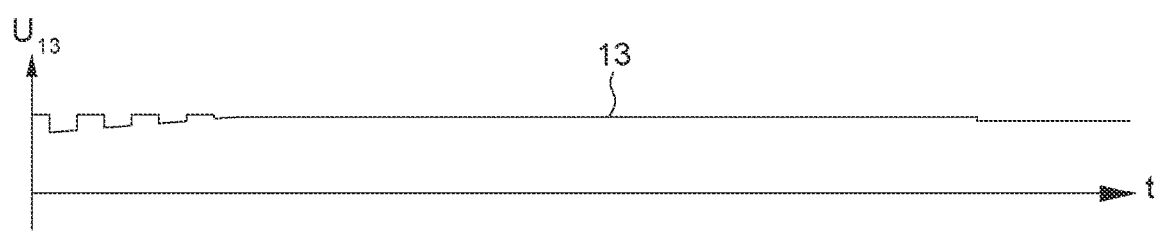
Figure 3C:
Figure 4:
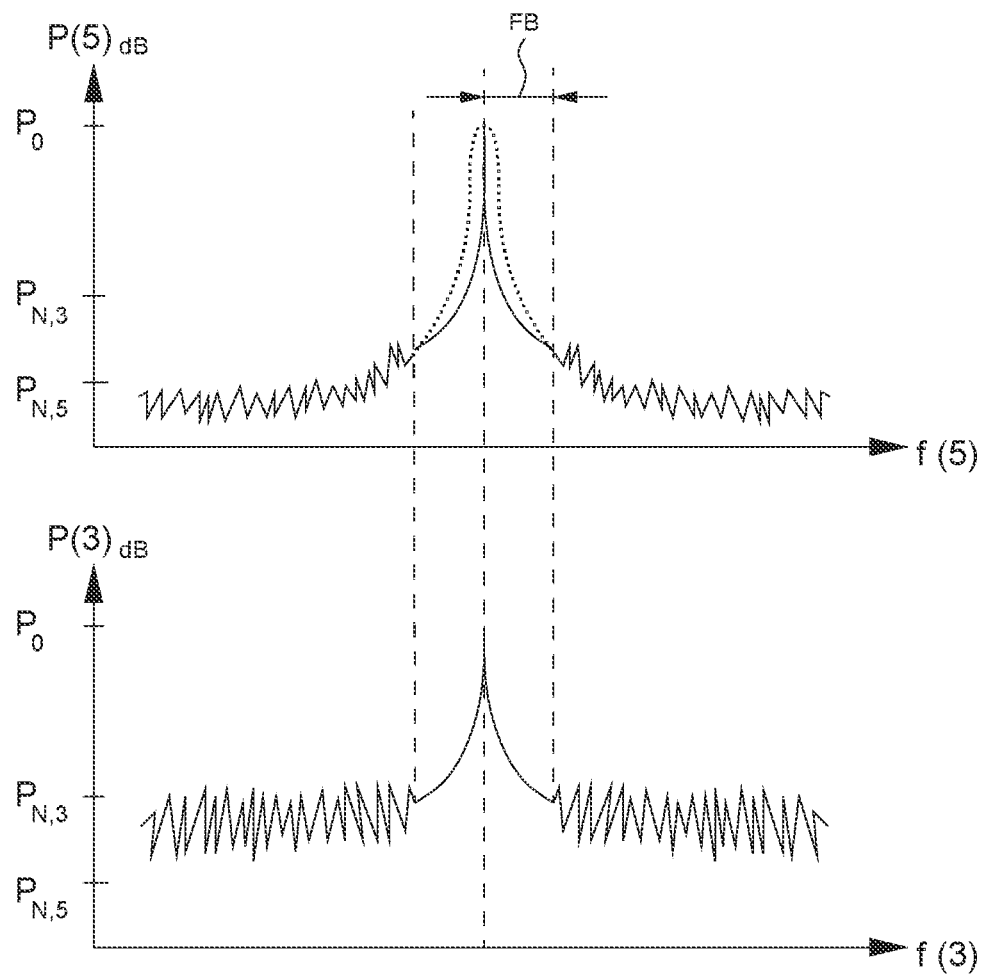
Figure 5:
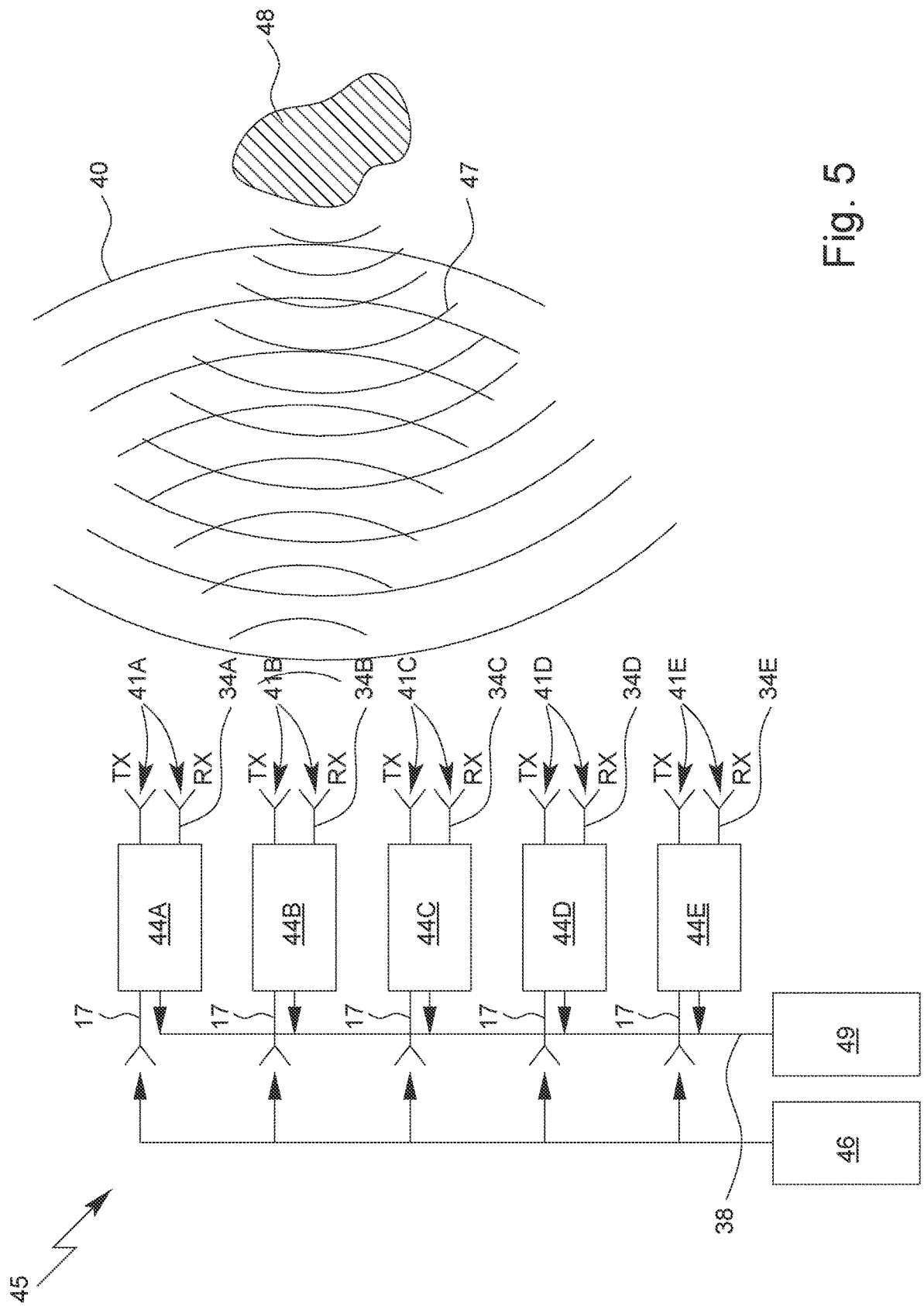

It shows:

FIG. 1 schematic, block diagram view of a proposed radar module with a proposed reference oscillator arrangement;

FIG. 2 Diagrams of a calibration signal and a first output signal of the reference oscillator arrangement according to the proposal versus time;

FIG. 3A Diagram of a selection signal versus time;

FIG. 3B Diagram of a control variable of the second reference oscillator versus time;

FIG. 3C Diagram of a tuning signal versus time;

FIG. 4 Plots of the output power of the first and second reference oscillators in dB versus frequency; and FIG. 5 a proposed radar system with several radar modules.

In the figures, the same reference signs are used for the same or similar parts, and corresponding properties and advantages may result, even if a repeated description is omitted.

FIG. 1 shows a simplified block diagram of a reference oscillator arrangement 1 according to the proposal. The reference oscillator arrangement 1 has a first reference oscillator 2 which is designed to generate a first output signal 3. Further, the reference oscillator arrangement 1 has a second reference oscillator 4 which is designed to generate a second output signal 5.

The reference oscillator arrangement 1 is preferably suitable or designed for radar applications. In particular, the second output signal 5 is suitable for enabling a radar signal generator to generate a radar signal. For this purpose, the second output signal 5 can serve as a reference or reference clock for an oscillator, divider and/or control loop, whereby the radar signal is generated or can be generated.

The first reference oscillator 2 and the second reference oscillator 4 are preferably adapted to generate output signals 3, 5 of at least substantially the same frequency.

The first output signal 3 and/or the second output signal 5 is/are preferably at least substantially periodic, form (a) clock signal(s), and/or are at least substantially sinusoidal and/or mono-frequency oscillations.

Particularly preferably, both the first output signal 3 and the second output signal 5 are at least substantially mono-frequency sinusoidal oscillations at at least substantially the same frequency. Accordingly, the first reference oscillator 2 and/or second reference oscillator 4 are designed to generate these output signals 3, 5. However, the output signals 3, 5 can also be or have deviating signal shapes such as square wave signals.

The first reference oscillator 2 is preferably a quartz oscillator, i.e. a quartz-stabilized reference oscillator 2 whose first output signal 3 is stabilized by using an oscillating quartz.

The second reference oscillator 4 is preferably a quartz oscillator, i.e. a quartz-stabilized reference oscillator 4 whose second output signal 5 is stabilized by the use of an oscillating quartz.

The first reference oscillator 2 and the second reference oscillator 4 are preferably different. In particular, they differ with regard to their structure, their circuit design and/or their frequency stability, their phase stability and/or their phase noise (of the respective output signal 3, 5 or in free-running mode).

The first reference oscillator 2 is preferably a temperature compensated crystal oscillator (TCXO). Here, the first reference oscillator 2 has a device for compensating for changes in the oscillation characteristics of the first reference oscillator 2 or in the frequency and/or phase of the first output signal 3 as a function of temperature. In particular, a temperature drift as a function of the temperature of the oscillating crystal of the first reference oscillator 2 is compensated hereby or the first reference oscillator 2 is designed for this purpose.

The temperature compensation of the first reference oscillator 2 can be performed by means of a temperature (drift) compensation device. This can be or have a heating device which keeps the crystal of the first reference oscillator 2 at a constant temperature, whereby the oscillation behavior of the first reference oscillator 2 is or is stabilized.

In contrast, a heating-free temperature compensation or heating-free temperature (drift) compensation device is preferred, i.e. a compensation or temperature (drift) compensation device that reduces or compensates for a temperature dependence of the behavior of the first reference oscillator 2 or its crystal without using a heater or without active heating.

The heating-free temperature compensation can be carried out, for example, via an analog or digital, temperature-dependent feedback or negative feedback via a control input of the first reference oscillator 2, in particular by means of a controller which determines control signals from a table depending on a temperature and sends them to the control input. Alternatively or additionally, the first output signal 3 can also be corrected on the basis of the temperature.

The first reference oscillator 2 is preferably controllable or tunable, in particular for the purpose of calibration. The first reference oscillator 2 is preferably controllable or tunable in order to be able to adjust a frequency and/or phase of the first output signal 3. In other words, the first reference oscillator 2 is preferably tunable, i.e. can be controlled or regulated with respect to the frequency and/or phase of the first output signal 3 that can be generated by the first reference oscillator 2.

Very preferably, the first reference oscillator 2 is therefore a tunable, temperature-compensated crystal oscillator (TCXO/TCCXO/TCVCXO).

The second reference oscillator 4 is preferably a controllable crystal oscillator (CXO), in particular a voltage-controlled crystal oscillator (VCXO). The second reference oscillator 4 is preferably not temperature compensated, thus (in contrast to the first reference oscillator 2) does not have a temperature (drift) compensation device. The second reference oscillator 4 is preferably designed to generate a second output signal 5 which has a lower phase noise than the first output signal 3 of the first reference oscillator 2 (in each case in free-running mode of the reference oscillator 2, 4).

In this context, a free-running reference oscillator 2, 4 is a reference oscillator 2, 4 that is uncontrolled, i.e. in the case of the second reference oscillator 4 when it is operated autonomously/uncontrolled, i.e. not controlled by the phase-locked loop.

The second reference oscillator 4 preferably has a signal generation characteristic which is decisive for the second output signal 5, or the second output signal 5 which can be generated by the reference oscillator 4 has (in free-running mode) a characteristic which is better than the corresponding signal characteristic of the first reference oscillator 2 or its first output signal 3. The second reference oscillator 4 is not necessarily a crystal oscillator, although this is particularly preferred.

Quite preferably, the second reference oscillator 4 has a phase noise which is lower than the phase noise of the first reference oscillator 2. For this purpose, stabilization by means of an oscillating crystal is quite preferably used, whereby the second reference oscillator 4 is a crystal oscillator, but this is not mandatory, provided that the signal characteristic, in particular the phase noise, is better in the second reference oscillator 4 or in its output signal 5 in free-running mode than in the first reference oscillator 2 or its output signal 3 by any other measures.

The reference oscillator arrangement 1 preferably has a PLL or phase-locked loop 6. This phase-locked loop 6 is designed to control the frequency and/or phase of the second reference oscillator 4 to the frequency and/or phase of the first reference oscillator 2. More precisely, the phase-locked loop 6 is designed to control the second reference oscillator 4 on the basis of the first output signal 3 of the first reference oscillator 2 in such a way that the frequency and/or phase of the second output signal 5 of the second reference oscillator 4 at least substantially corresponds to the frequency and/or phase of the first output signal 3 of the first reference oscillator 2 (in particular close to the carrier/in the frequency range directly around the oscillation frequency).

The phase control circuit 6 is thus preferably designed to discipline the phase of the second output signal 5 of the second reference oscillator 4 to the phase of the first output signal 3 of the first reference oscillator 2. In this way, the second output signal 5 preferably maintains the characteristics of the first output signal 3 of the first reference oscillator 2 in terms of frequency stability.

The first reference oscillator 2 preferably exhibits (in free-running mode) better frequency stability than the second reference oscillator 4. Accordingly, the frequency stability of the second reference oscillator 4 is improved by disciplining with the first output signal 3 of the first reference oscillator 2 via the phase locked loop 6.

Alternatively or additionally, the second reference oscillator 4 or its second output signal 5 (in particular far from the carrier/away from the oscillation frequency) has a better phase noise than the first reference oscillator 2 or its first output signal 3. These properties again preferably refer to the case of the respective free-running reference oscillator 2, 4.

The phase-locked loop 6 is preferably designed to discipline the second reference oscillator 4 or its output signal 5 now in the frequency range directly around the frequency of the first output signal 3 or the first reference oscillator 2, i.e. to impress on the second reference oscillator 4 or its second output signal 5 the characteristics of the frequency or frequency stability of the first reference oscillator 2 or the first output signal 3.

This makes it possible in an advantageous manner to generate a second output signal 5 by the second reference oscillator 4, which in terms of frequency stability has the characteristics of the first reference oscillator 2 or its first output signal 3 and furthermore, away from the frequency of the first and/or second output signal 3, 5, has the improved oscillation characteristics of the second reference oscillator 4 or the second output signal 5, in particular the better or lower phase noise.

Therefore, coupling the first reference oscillator 2 with the second reference oscillator 4 via the phase locked loop 6 enables the generation of the second output signal 5 with characteristics better than the characteristics of the first output signal 3 and the second output signal 5 in the case of free-running reference oscillators 2, 4.

In the illustrative example, the improved frequency stability of the first reference oscillator 2 is preferably based primarily on the preferably provided temperature compensation of the first reference oscillator 2, whereby a temperature drift of the frequency and/or phase of the first output signal 3 is compensated. Alternatively or additionally, the first reference oscillator 2 may have other or complementary measures for reducing or compensating for frequency changes. These or corresponding measures are preferably not implemented in the second reference oscillator 2. This is therefore preferably free of temperature compensation.

At least the second reference oscillator 4 is preferably tunable, i.e. can be controlled or regulated with respect to the frequency and/or phase of the second output signal 5 which can be generated by the second reference oscillator 4. In the present case, a corresponding regulation is preferably performed by the phase-locked loop 6 in which the second reference oscillator 4 is integrated.

Specifically, the phase-locked loop 6 has a feedback 7 for the second output signal 5. The feedback 7 can in principle have a divider, which is not the case in the illustrative example and in the reference oscillator arrangement 1 according to the proposal and is accordingly not shown.

The phase-locked loop 6 preferably has a phase-frequency detector 8. This is designed to compare the (optionally divided) second output signal 5 applied to a feedback input 9 of the phase-frequency detector 8 via the feedback 7 with a signal applied to a reference input 10 of the phase-frequency detector 8, preferably the first output signal 3 of the first reference oscillator 2.

This forms a phase-frequency detector output signal, hereinafter referred to as PFD output signal 11. This can be processed by filtering with a loop filter 12 to form a control variable 13 of the phase-locked loop 6, which is coupled to the second reference oscillator 4 for control, regulation and/or tuning of the latter.

In this case, the phase-locked loop 6 is preferably set up to reduce or compensate for a frequency and/or phase difference between the feedback input 9 and the reference input 10, i.e. to generate a PFD output signal 11 which, filtered by the loop filter 12, controls the second reference oscillator 4 in a corresponding manner in order to minimize the phase and/or frequency deviation between the feedback input 9 and the reference input 10 or signals coupled therewith.

Through this, the phase-locked loop 6 enables the second reference oscillator 4 to be controlled to generate the second output signal 5 so that, in the bandwidth (loop bandwidth FB) specified by the phase-locked loop 6 and in particular by the loop filter 12, the second output signal 5 (by the frequency of the signal at the reference input 10 or of the first output signal 3) corresponds at least substantially to the signal present at the reference input 10, preferably to the first output signal 3 of the first reference oscillator 2.

The phase-locked loop 6 and/or the loop filter 12 is/are preferably designed to control the second reference oscillator 4 or its second output signal 5 only at or in the immediate vicinity of the frequency of the first reference oscillator 2 or the frequency of the first output signal 3. In particular, a narrow-band loop filter 12 can be provided for this purpose, so that outside the bandwidth of the loop filter 12 the free-running characteristics of the second reference oscillator 4 shape the second output signal 5.

Since the second reference oscillator 4 preferably has qualitative advantages over the first reference oscillator 2 in these areas, the characteristics of the first reference oscillator 2 and the second reference oscillator 4 are combined in a synergistic manner by the phase-locked loop 6 to produce the second output signal 5.

In particular, a second or higher order filter is used as the loop filter 12.

The 3-dB bandwidth of the loop filter 12 or of the phase-locked loop 6 may, for example, be less than 1 MHz, preferably less than 100 kHz or 10 kHz, in particular less than 1 kHz. It may be provided that the 3 dB bandwidth is less than 500 Hz, 200 Hz or 100 Hz.

The loop filter 12 is preferably a low-pass filter. In particular, it is a low-pass filter of second or higher order. However, other solutions are possible as well.

The reference oscillator arrangement 1 is preferably a coherent electronic assembly. In particular, at least the first reference oscillator 2 and the second reference oscillator 4 form parts of the same module or are coupled to each other by wire, are part of the same electrical circuit, are supplied with electrical energy by the same power supply, are accommodated in the same housing, are provided on the same carrier and/or carriers connected to each other or fixed to each other, are arranged fixedly, rigidly or immovably with respect to each other, and/or the first reference oscillator 2 is not merely coupled wirelessly to the second reference oscillator 4.

The reference oscillator arrangement 1 according to the proposal preferably has a calibration input 14 for a calibration signal 15. The calibration signal 15 may originate from a calibration signal source 16. For example, it is a calibration signal 15 derived from a satellite navigation signal 17 such as a GPS signal. Alternatively or additionally, the calibration signal 15 can be or can comprise or can be derived from a network synchronization signal (for example, Synchronous Ethernet (SyncE), IEEE 1588 or the like) and/or a (radio) timing signal.

The reference oscillator arrangement 1 may be associated with the calibration signal source 16, or the reference oscillator arrangement 1 may include the calibration signal source 16.

The reference oscillator arrangement 1 is preferably designed for self-sufficient operation, i.e. can form the second output signal 5 in the manner described if only a power supply is provided. In particular, no external signals such as the calibration signal 15 are required for the reference oscillator arrangement 1 according to the proposal to be functional.

The calibration signal 15 can be suitable for having or prescribing a frequency and/or phase on the basis of which the reference oscillator arrangement 1 can be calibrated. In particular, the reference oscillator arrangement 1 can be designed to match or synchronize the frequency and/or phase of the first reference oscillator 2 to that of the, preferably external, calibration signal 15.

In the illustrative example, the provided calibration signal 15 is applied to the reference input 10 of the phase-frequency detector 8 of the phase-locked loop 6 via a multiplexer 18 as an alternative to the first output signal 3 of the first reference oscillator 2. In this way, the phase-locked loop 6 synchronizes the second reference oscillator 4 or its output signal 5 with the calibration signal 15 when the latter is coupled to the reference input 10.

Further, the reference oscillator arrangement 1 may comprise a control device 20. The control device 20 may be adapted to provide a selection signal 21. This can control the multiplexer 18 such that the output signal 3 is applied to the reference input 10 of the phase-frequency detector 8 in order to synchronize the second reference oscillator 4 or its output signal 5 thereto. The control device 20 may alternatively or additionally be adapted to use the selection signal 21 to control the multiplexer 18 such that the calibration signal 15 is applied to the reference input 10 of the phase-frequency detector 8 to synchronize the second reference oscillator 4 or its output signal 5 thereto.

The control device 20 may have a time base 20A, in particular a clock. This time base 20A, in particular system time base, may be synchronized with a further calibration signal 19, for example time information which may be derived from or formed by the satellite navigation signal 17, a radio clock signal or other time reference signal such as a network synchronization signal (in particular IEEE 1588 and/or Synchronous Ethernet).

Alternatively or additionally, the control device 20 may control the multiplexer 18 to couple the calibration signal 15 or the first output signal 3 to the reference input 10, in particular depending on the reception of the satellite navigation signal 17, the time base 20A or an alternative thereto, a status of the calibration signal source 16, and/or after a period of time has elapsed since the last calibration or in the presence of some other criterion related to a need for calibration.

The control device 20 is preferably designed to calibrate the first reference oscillator 2. Hereby, a frequency and/or phase difference between the frequency and/or phase of the first output signal 3 of the first reference oscillator 2 and the frequency and/or phase of the calibration signal 15 can be reduced or compensated.

In other words, a frequency difference between the frequency of the first output signal 3 of the first reference oscillator 2 and the frequency of the calibration signal 15 can be reduced or compensated, or a phase difference between the phase of the first output signal 3 of the first reference oscillator 2 and the phase of the calibration signal 15 can be reduced or compensated.

For calibration, the first reference oscillator 2 is preferably tunable. The first reference oscillator 2 is designed in particular as a digital or analog frequency-tunable reference oscillator 2. Through this, the frequency and/or phase position of the first output signal 3 of the first reference oscillator 2 can be adapted to the calibration signal 15. On the one hand, this enables improved absolute frequency accuracy of the reference oscillator arrangement 1 and, on the other hand, synchronization of several reference oscillator arrangements 1, which will be discussed later.

The control device 20 is preferably designed to couple the calibration signal 15 with the phase-locked loop 6 so that the phase-locked loop 6 of the second reference oscillator 4 or its output signal 5 is synchronized or can be synchronized with the calibration signal 15. In particular, the multiplexer 18 can be controlled accordingly by the control device 20 with the selection signal 21.

Particularly preferably, the reference oscillator arrangement 1 or the control device 20 is designed to determine differences between frequencies and/or phases of the calibration signal 15 on the one hand and the output signal 3 of the first reference oscillator 2 on the other hand or values or parameters corresponding thereto.

Alternatively or additionally, the control device 20 can be designed to minimize differences in frequency and/or phase between the calibration signal 15 and the output signal 3 of the first reference oscillator 2 by calibrating the first reference oscillator 2. For this purpose, the control device 20 can generate a tuning signal 22 which, optionally via a frequency control device 23—in the present case a digital frequency control unit—tunes the first reference oscillator 2.

FIG. 2 shows in a simplified schematic diagram examples of a voltage U15 of the calibration signal 15 and a voltage U3 of the first output signal 3 of the first reference oscillator 2 over time t in comparison. In the example shown, the voltage U15 of the calibration signal 15 and the voltage U3 of the first output signal 3 are not yet synchronized, so that the phase difference 24 between the voltages U15, U3 changes due to a frequency deviation.

A calibration of the first reference oscillator 2 preferably results in the first output signal 3 of the first reference oscillator 2 becoming at least substantially frequency and/or phase synchronous with the calibration signal 15.

Further referring to FIG. 1, the reference oscillator arrangement 1 and in particular the control device 20 of the reference oscillator arrangement 1 is preferably designed to effect calibration of the first reference oscillator 2 on the basis of a or the control variable 13 of the phase-locked loop 6. For this purpose, it is preferably provided that the control variable 13 of the phase-locked loop 6 is determined with the calibration signal 15 coupled to the phase-locked loop 6 or its reference input 10. On this basis, the first reference oscillator 2 can be tuned in such a way that the control variable 13 with the first reference oscillator 2 coupled to the phase-locked loop 6, i.e. with the first output signal 3 applied to the reference input 10, corresponds at least essentially to the control variable 13 with the calibration signal 15 coupled to the phase-locked loop 6.

This preferably causes a frequency alignment of the internal first reference oscillator 2 used for island operation with the external calibration signal 15 of the (external) calibration signal source 16 which is applied or can be applied at least temporarily, in particular at the reference input 10.

In concrete terms, therefore, the control variable 13 can be determined when the calibration signal 15 is applied to the reference input 10, in particular by the control device 20, and subsequently the first reference oscillator 2 or its output signal 3 can be coupled to the reference input 10, whereby a different control variable 13 can initially be produced. The reference oscillator arrangement 1 or the control device 20 is then designed to tune the first reference oscillator 2—in particular via the tuning signal 22—in such a way that the same control variable 13 results as was the case with the calibration signal 15 coupled to the reference input 10. In this way, the first reference oscillator 2 can be synchronized accordingly with the calibration signal 15.

In principle, the synchronization of the first reference oscillator 2 or its output signal 3 with the calibration signal 15 or via the further calibration signal 19—in particular with the satellite navigation signal 17, a radio clock reference signal, another radio time signal and/or a network protocol or network time protocol signal—can also be performed otherwise or directly.

FIGS. 3A to 3C show exemplary diagrams of the selection signal 21 (its voltage U21) versus time t, the control variable 13 (its voltage U13) of the phase-locked loop 6 or second reference oscillator 4 versus time t, and the tuning signal 22 (its voltage U22) versus time t.

Particularly preferably, the tuning is performed by a tuning method which the reference oscillator arrangement 1 may be adapted to perform and which may also form an independent aspect of the present invention.

The reference oscillator arrangement 1 can support at least two operating modes, where in a first operating mode the reference input 10 is fed with the first output signal 3 of the first reference oscillator 2 (normal operation) and in a second operating mode with the calibration signal 15 (calibration operation). This can be determined via the selection signal 21 with the multiplexer 18.

In the illustration example according to FIG. 3A, the selection signal 21 is for example digital and controls the multiplexer 18 at 'logic 1' in such a way that it routes the first output signal 3 to the reference input 10 (first operating mode) and at 'logic −1' in such a way that it routes the calibration signal 15 to the reference input 10 (second operating mode). Accordingly, the second reference oscillator 4 is locked to the signal present at the reference input 10, thus adopting its frequency and phase due to the control of the phase locked loop 6. In the example, this is the frequency and phase of the first output signal 3 for 'logic 1' and the frequency and phase of the calibration signal 15 for 'logic −1'. The control variable 13 corresponds to the frequency of the second output signal 5, so that if the control variable 13 is constant, the frequency of the second output signal 5 is unchangeable or does not change. Conversely, the first reference oscillator 2 is calibrated to the calibration signal 15 in this case—so they preferably have the same frequency. The form of the selection signal 21 is exemplary and can of course also be of a different nature.

Preferably, for tuning the first reference oscillator 2, it is alternated, in particular several times, between the first and the second operating mode. The reference input 10 of the reference oscillator arrangement 1 is thus alternately fed with the first output signal 3 of the first reference oscillator 2 and with the calibration signal 15.

Accordingly, the second reference oscillator 4 is controlled by the phase-locked loop 6 in such a way that its frequency or phase alternately at least substantially matches the frequency or phase of the first output signal 3 of the first reference oscillator 2 and the frequency or phase of the calibration signal 15. The second reference oscillator 4 can be used here as a so-called jitter cleaner.

Here, the control variable 13, in particular tuning voltage, of the second reference oscillator 4 is monitored, while the reference input 10 is alternately fed with the first output signal 3 of the first reference oscillator 2 and with the calibration signal 15.

Further, the tuning signal 22 is tracked, in particular regulated, so that the control variable 13 remains at least substantially unchanged during the change.

Since the control variable 13 of the second reference oscillator 4 determines its frequency, the control variable 13 then remains at least substantially unchanged during the changeover if the frequency of the second reference oscillator 4 is also constant Since the frequency of the second reference oscillator 4 corresponds to that of the first reference oscillator 2 when the output signal 3 is coupled to the reference input 10, and the frequency is tuned to remain the same during the changeover, the first reference oscillator 2 generates the frequency of the calibration signal 15 after the method has been carried out.

Thus, the frequency of the first reference oscillator 2 is indirectly calibrated to that of the calibration signal 15 via the control variable 13.

In other words, the tuning voltage signal (control variable 13) of the second reference oscillator 4 is evaluated and the multiplexer 18 is used to switch the reference input 10 between the calibration signal 15 from an external source and the first output signal 3 of the first reference oscillator 2. In this process, the frequency of the first (internal) reference oscillator 2 is matched to that of the external calibration signal 15 (from an external reference oscillator) by changing the frequency of the internal first reference oscillator 2 until no change in the tuning voltage signal (control variable 13) is detected when the multiplexer 18 is switched.

In normal operation, the internal first reference oscillator 2 is frequency controlled to the calibration signal 15 (of an external reference oscillator) and then operated in free-running mode. This is an isolated operation with the first reference oscillator 2, but it can be calibrated with external frequency standard or the calibration signal 15 (of an external reference oscillator). The second reference oscillator 4 is preferably used as a jitter cleaner to improve the carrier-far noise of the first reference oscillator 2.

In another, alternative or additional (third) operating mode, also called composite mode, the first reference oscillator 2 is preferably not used and instead the second reference oscillator 4 is locked to the calibration signal 15 (of an external reference oscillator or calibration signal source 16). Here, the second reference oscillator 4 can be used as a jitter cleaner for the calibration signal 15. This operating mode can correspond to the second operating mode, with the difference that the change of the reference input 10 to the first output signal 3 of the first reference oscillator 2 is omitted.

Since in this other, alternative or additional (third) operating mode the second reference oscillator 4 is (permanently) locked to the calibration signal 15 or the (external) calibration signal source 16 preferably according to frequency and phase—in particular by permanently applying the calibration signal 15 to the reference input 10—several reference oscillator arrangements 1 or systems can be operated therewith, preferably as a compound, phase-locked together or to each other.

In the illustrative example shown in FIG. 1, a network synchronization signal or GPS signal may have time synchronization information as an example of a satellite navigation signal 17, which may be processed by the calibration signal source 16 as a calibration signal 19, if necessary, by the control device 20.

Particularly preferably, the control device 20 has a time base 20A, in particular a clock, which is further particularly preferably synchronized or synchronizable with the calibration signal 19. In particular, a system time is synchronized.

Time synchronized radar signals 36 may be generated using the time base 20A. For this purpose, the control device 20 may control (trigger) a radar module to generate mutually synchronized radar signals. In particular, this is done such that simultaneous frequency ramps are generated.

The clock for the time base 20A is preferably taken from the second output signal 5, or the second output signal 5 is used as the clock for the time base 20A.

The second output signal 5 can preferably provide a clock with its frequency either by synchronization of the second reference oscillator 4 to the first output signal 3 or to the calibration signal 15. Alternatively, only or additionally the time can be supplied via the calibration signal source 16. Then the clock can be taken from another internal source, i.e. preferably from one of the reference oscillators 2, 4.

Via network using SyncE for the clock and/or IEEE 1588 for the time synchronization, both information can also come directly from an external source (calibration signal source 16) and then be used provided with the good phase noise of the second reference oscillator 4 via the Jitter Cleaner PLL.

Via the synchronized time base 20A in the control device 20, trigger times can be arranged between several radar sensors at which radar signals, in particular frequency ramps, or other output signals can then be synchronized or started. FIG. 4 shows in a simplified diagram a power spectral density $P(5)_{dB}$, $P(3)_{dB}$ versus frequency of the first output signal 3 and the second output signal 5 in comparison. Dashed in the diagram of the second output signal 5 is the power spectral density in dB over the frequency of the free-running second reference oscillator 4.

By using the phase-locked loop 6, in the range of the frequency of the second output signal 5, the frequency stability of the first output signal 3 of the first reference oscillator 2 is imposed on it by means of the regulations brought about by the phase-locked loop 6, so that the frequency stability of the second reference oscillator 4 around the carrier or (center or carrier) frequency is transferred to the second output signal 5.

Away from the (center or carrier) frequency or outside the bandwidth FB of the loop filter 12, the second output signal 5 exhibits the preferably lower phase noise compared to the first output signal 3 at a phase noise level $_{PN,5}$ of the free-running second reference oscillator 4 or its second output signal 5 compared to a higher phase noise level $_{PN,3}$ of the first reference oscillator 2 or its first output signal 3. This leads in a synergistic manner to the advantageous combination of preferred characteristics of both reference oscillators 2, 4.

In the representation example according to FIG. 1, the second reference oscillator 4 is coupled to a clock device 25 for providing a clock signal 29 derived from the second output signal 5 of the second reference oscillator 4. Here, it can be provided that the clock device 25 generates one or more clocks/clock signals 29 on the basis of the second output signal 5 by dividing the second output signal 5, or the clock device 25 is designed for this purpose.

The control device 20 can generate a reset signal 26, which can reset the clock device 25 or set it to a certain (output) state via a reset input 27 of the clock device 25. In this way, a further synchronization, in particular with the calibration signal 15, the satellite navigation signal 17 and/or the further calibration signal 19 can take place.

The clock device 25 can have one or more (frequency) dividers 28 via which a clock signal 29 can be generated. The clock signal 29 can be formed directly by the second output signal 5 and/or by a divided output signal 5. In the illustrative example, several, in particular three, dividers 28 are provided. In the representation example, the clock signal 29 has the second output signal 5 as well as the divided second output signal 5. However, other solutions are also possible here.

The clock signal 29 can be applied to or coupled with a clock input 30 of a (radar) transceiver 31. The (radar) transceiver 31 preferably forms part of a radar device 32.

The radar device 32 may include a radar receiver 33 for receiving and processing a received signal 34.

The radar device 32 preferably comprises a radar signal generator 35 for generating a radar signal 36. In particular, the radar signal generator 35 is designed for generating radar signals for FMCW radar systems, in particular for forming so-called frequency ramps, i.e. radar signals with a continuous, steady and/or linear frequency change over time.

The radar signal generator 35 may be adapted to generate the radar signal 36 on the basis of the second output signal 5 of the reference oscillator 4 and/or on the basis of the clock signal 29 derived therefrom or formed thereby.

The radar signal generator 35 preferably has a voltage-controlled oscillator in particular. This is preferably a crystal-free or not directly crystal-stabilized oscillator.

The oscillator of the radar signal generator 35 preferably generates or is designed to generate a frequency that is higher than the frequency of the first output signal 3 and/or the second output signal 5. The oscillator of the radar signal generator 35 preferably generates or is designed to generate a frequency that is a multiple of the frequency of the first output signal 3 and/or the second output signal 5. The oscillator of the radar signal generator 35 is preferably a millimeter wave oscillator or oscillator for generating frequencies of more than 5 GHz, preferably more than 10 GHz, in particular more than 20 GHz or 30 GHz.

The first reference oscillator 2 and/or the second reference oscillator 4 preferably generate or are designed to generate a frequency that is a fraction of the frequency (frequency of the radar signal 38) generated by the radar signal generator 35 or by the oscillator of the radar signal generator 35. The first reference oscillator 2 and/or the second reference oscillator 4 may generate substantially the same and/or a frequency below 20 GHz or 30 GHz, preferably below 10 GHz, in particular below 5 GHz. Particularly preferably, the frequency of the first reference oscillator 2 and/or the second reference oscillator 4 and/or their output signal(s) 3, 5 is in the megahertz range.

The oscillator of the radar signal generator 35 is preferably controlled, synchronized and/or stabilized on the basis of the second output signal 5 of the reference oscillator 4 and/or on the basis of the clock signal 29 derived therefrom or formed thereby, or the reference oscillator arrangement 1 or the radar system 45 is designed for this purpose.

For this purpose, the radar signal generator 35 can have a phase-locked loop for controlling the oscillator of the radar signal generator 35, in particular a voltage-controlled oscillator. This phase-locked loop of the radar signal generator is further preferably designed for controlling the oscillator of the radar signal generator 35 to the second output signal 5 of the second reference oscillator 4 and/or to the clock signal 29 derived therefrom.

Thus, the phase control circuit of the radar signal generator 35 preferably controls the frequency of an output signal of the oscillator of the radar signal generator 35 to the frequency of the second output signal 5 of the second reference oscillator 4 and/or the clock signal 29 derived therefrom. Alternatively or additionally, the phase control circuit of the radar signal generator 35 controls the phase of an output signal of the oscillator of the radar signal generator 35 to the frequency of the second output signal 5 of the second reference oscillator 4 and/or the clock signal 29 derived therefrom.

By means of the phase control loop of the radar signal generator 35, the characteristics of the second output signal 5 can be impressed on the oscillator of the radar signal generator 35, or the radar signal generator 35 and/or the radar device 32 is designed for this purpose. Accordingly, the radar signal 36 generated by the oscillator of the radar signal generator 35 preferably exhibits the (low) phase noise of the second output signal 5 generated by the second reference oscillator 4 and, preferably, further exhibits the temperature stability impressed on the second reference oscillator 4 by the first reference oscillator 2.

The radar signal generator 35 is preferably designed to control or regulate the oscillator of the radar signal generator 35 so that it generates the radar signal 36, in particular FMCW frequency ramps. Due to the present invention, the radar signal 36 has in this case a particularly high precision and stability, i.e. low phase noise close to the carrier and good temperature stability.

The radar receiver 33 may include a mixer 37 that processes the received signal 34 based on the radar signal 36 or is configured to do so. In particular, the mixer 37 generates an intermediate frequency signal, also called IF signal 38, from the received signal 34 by mixing it with the radar signal 36. Alternatively or additionally, the mixer 37 can mix the received signal 34 with the radar signal 36 directly into a baseband, in particular wherein signal components of the received signal 34 are mixed at the same frequency as those of the simultaneously present radar signal 36 to form a DC component and/or components of the received signal 34 with a frequency deviating from the radar signal 36 are output as an output signal of the mixer 37 at the difference frequency from the frequency of the received signal 34 and the frequency of the radar signal 36.

The radar signal 36 can alternatively or additionally be output or emitted as a transmit signal 40 via a radar transmitter 39.

The control device 20 can optionally generate a control signal 42 or be designed to control, in particular to activate and/or deactivate, the generation of the radar signal 36 and/or the transmitting and/or receiving function of the radar device 32 via a control input 43 of the radar signal generator 35 or of the radar device 32, preferably by means of the control signal 42.

Preferably, the control signal 42 is derived from the time base 20A or the further calibration signal 19 or the satellite navigation signal 17 or another reference signal, so that different radar signal generators 35 can be synchronized, in particular to form synchronous radar signals 36, especially frequency ramps.

The radar device 32, in particular the radar receiver 33 and/or the radar transmitter 39 can have one or more antennas 41. In the illustration example, one antenna 41 is provided for transmitting the radar signal 36 (as transmit signal 40) and one (other) antenna 41 is provided for receiving the receive signal 34. In principle, however, the same antenna 41 can also be used for this purpose, or several or one multi-part antenna can be provided for this purpose.

The reference oscillator arrangement 1 according to the proposal preferably comprises at least the first reference oscillator 2, the second reference oscillator 4 and the phase-locked loop 6. Further components are preferred, but optional. In particular, it may be provided that the control device 20 or parts thereof and/or the radar device 32 and the reference oscillator arrangement 1 form separate parts or separate functional blocks. Thus, the reference oscillator arrangement 1 together with the radar device 32 may form a radar module 44. The radar module 44 thus preferably comprises at least the reference oscillator arrangement 1 comprising the first reference oscillator 2, the second reference oscillator 4 and the phase-locked loop 6 as well as, in addition, the radar device 32.

In FIG. 5 a radar system 45 is schematically shown, which has several reference oscillator arrangements 1 or radar modules 44—each having a reference oscillator arrangement 1. At least one of the radar modules 44 has a reference oscillator arrangement 1 according to the proposal with the first reference oscillator 2, the second reference oscillator 4 and the phase-locked loop 6. In principle, however, it is preferred that several or all of the radar modules 44 also each have a reference oscillator arrangement 1 in accordance with the proposal.

The radar system 45 preferably has a clock synchronization device 46 for synchronizing the reference oscillator arrangements 1 of the respective radar modules 44. In particular, this may be a GPS satellite or other reference or source for the calibration signal 15.

In the illustrative example, the clock synchronization device 46 provides a satellite navigation signal 17 such as a GPS, GLONASS, Galileo and/or Beidou signal and/or a network synchronization signal, in particular for synchronization via IEEE 1588 and/or Synchronous Ethernet, and/or a radio time signal such as a DCF77 signal, with which the respective radar modules 44 or their reference oscillator arrangements 1 and/or radar signal generators 35 can be calibrated with each other or to the (common) calibration signal 15 or synchronized therewith.

Particularly preferably, the control devices 20 of the respective reference oscillator arrangements 1 or radar modules 44 each have a time base 20A, in particular a clock, which are further particularly preferably synchronized or synchronizable with each other or each with the same calibration signal 15, 19. By means of the respective time base 20A, time-synchronized radar signals 36 can be generated. For this purpose, the respective control device 20 can control (trigger) the respective radar module 44 or its divider 28 for generating mutually synchronized radar signals 36. In particular, this is done in such a way that simultaneous frequency ramps are generated.

By means of the clock synchronization device 46, the reference oscillators 2, 4 or the clock signals 29, which can be generated by the reference oscillators 2, 4, of the reference oscillator arrangements 1 or radar modules 44, in particular the second output signals 5 thereof, can be synchronized with one another accordingly. This makes it possible to provide second output signals 5 that are synchronized with one another.

In particular, the synchronized second output signals 5 are frequency synchronous and/or phase synchronous. Accordingly, the respective radar modules 44 can generate frequency-synchronous and/or phase-synchronous clock signals 29, with which correspondingly synchronized radar signals 36 can be generated by the respective radar modules 44, which are preferably in turn synchronized and/or synchronizable with one another, or by their radar signal generators 35, which are preferably in turn synchronized and/or synchronizable with one another.

In particular, the respective radar modules 44 or their reference oscillator arrangements 1 can generate mutually identical or synchronous radar signals 40 such as FMCW radar signals, in particular frequency ramps or FMCW ramps. This makes it possible in an advantageous manner to process, decode and/or analyze a received signal 34 and thereby extract an information content of the received signal 36, even if the transmitted signal 40 on which the received signal 34 is based does not originate from the same radar module 44.

In the illustrative example according to FIG. 5, a plurality of radar modules 44, in particular a first radar module 44A, a second radar module 44B, a third radar module 44C, a fourth radar module 44D, and a fifth radar module 44E, are provided. In the illustrative example, only the second radar module 44B transmits a radar signal 36 generated by it via an antenna 41B of the second radar module 44B as a transmission signal 40.

The transmitted signal 40 becomes the reflected signal 47 due to reflections from an object 48. The reflected signal 47 forms the respective received signal 34A to 34E when received by one of the radar modules 44 or an antenna 41A of the first radar module 44, an antenna 41B of the second radar module 44B, an antenna 41C of the third radar module 44C, an antenna 41D of the radar module 44D, and/or an antenna 41E of the fifth radar module 44E.

The received signals 34A to 34E differ from each other due to the preferably different position or location or orientation of the respective radar modules 44A to 44E. Thus, the respective radar modules 44A to 44E are preferably at different locations or are designed and arranged to be at different locations. In any case, if the object 48 does not reflect the transmitted signal 40 uniformly in space, correspondingly differing received signals 34A to 34E result, whereby additional information about the object 48 can be determined. For this purpose, the respective received signals 34A to 34E can be evaluated, in particular compared, individually or jointly via a signal processing device 49 of the radar system 45.

In the illustrative example according to FIG. 5, the respective radar modules 44 can be synchronized or synchronized with one another, in particular their reference oscillator arrangements 1 can be synchronized or synchronized with one another in the manner described, so that the received signals 34A to 34E can be evaluated in each case and, in particular, supplementary information can be determined by comparison on the basis of the spatial distribution of the individual radar modules 44, even if only one or a genuine subset of the radar modules 44 present overall or provided in the radar system 45 transmit one or more transmitted signal(s) 40.

The radar modules 44 or multiple reference oscillator arrangements 1 may be synchronized via satellite navigation signals 17 or alternatively or additionally via a network interface, for example via a system time synchronization protocol such as IEEE1588. Alternatively or additionally, the calibration signal 15 may be distributed to the reference oscillator arrangements 1 or radar modules 44 via synchronous Ethernet systems (SyncE).

It can also be provided that the radar modules 44 each transmit one or the (synchronized) transmission signal 40 alternately or successively, and in each case preferably several or all radar modules 44 (can) process and evaluate their reception signals 34A to 34E, i.e. the reflection signal 47 received at the respective position of the respective radar module 44.

In a method or application according to the proposal, it can be provided that several reference oscillators 2, 4 are synchronized with each other, whereby the first of the reference oscillators 2 has a better frequency accuracy or reference stability than the second reference oscillator 4, and the second reference oscillator 4 having a lower phase noise in free-running mode than the first reference oscillator 2, and the frequency of the second reference oscillator 4 being controlled to the frequency of the first reference oscillator 2, in particular by means of a phase-locked loop 6, and the frequency of the first reference oscillator being calibrated on the basis of a calibration signal 15.

Particularly in radar systems 45, especially FMCW radar systems, the reference oscillator arrangement 1 according to the proposal offers, due to the second output signal 5 provided by it with improved properties with regard to stability and accuracy, the possibility of considerably improving the measurement accuracy of the radar system 45 or radar module 44 with such a reference oscillator arrangement 1. In particular, the measurement accuracy is considerably improved when the reference oscillator arrangement 1 according to the proposal is used for distance measurement or level measurement, so that distances, speeds, etc. can be determined more accurately and reliably.

At the same time, the use of oven quartz oscillators is preferably avoided. These offer good precision and stability, but at the cost of high power consumption and a relatively long heating-up phase in which the precision and stability achieved after heating-up are not yet present. The reference oscillator arrangement 1 according to the proposal provides the second output signal 5 with a frequency stability and phase noise similar to those of a oven quartz oscillator, but without the associated disadvantages including the high production cost of oven quartz oscillators, which is why the latter are generally reserved for special applications.

The reference oscillator arrangement 1 according to the proposal thus provides a reference signal or clock source which, due to its precision, frequency stability and resource-saving manufacturing process, enables a considerable improvement even of devices with large quantities compared to oven quartz oscillators—despite the use of preferably two oscillating crystals.

The present invention relates to the following aspects, alternatively or in addition to those previously explained:

1. Reference oscillator arrangement 1 having a first reference oscillator 2 for generating a first output signal 3 and a second reference oscillator 4 for generating a second output signal 5, and the reference oscillator arrangement 1 having a phase-locked loop 6 for controlling the frequency and/or phase of the second reference oscillator 4 to the frequency and/or phase of the first reference oscillator 2.

2. Reference oscillator arrangement 1 according to aspect 1, characterized in that the first reference oscillator 2 and/or the second reference oscillator 4 is/are a quartz oscillator, preferably
wherein the first reference oscillator 2 is a temperature-compensated quartz oscillator, and/or has a better frequency stability in free-running mode than the second reference oscillator 4, and/or
wherein the second reference oscillator 4 is a tunable and/or non-temperature compensated crystal oscillator, and/or has a lower phase noise in free-running mode than the first reference oscillator 2.

3. Reference oscillator arrangement 1 according to aspect 1 or 2, characterized in that the frequency and/or phase of at least the second reference oscillator 4 can be tuned and the phase-locked loop 6 is designed to control the frequency and/or phase of the second reference oscillator 4 to the frequency and/or phase of the first reference oscillator 2.

4. Reference oscillator arrangement 1 according to any of the preceding aspects, characterized in that the reference oscillator arrangement 1 has a control input for an external calibration signal 15 and is designed to match the frequency and/or phase of the first reference oscillator 2 to the external calibration signal 15.

5. Reference oscillator arrangement 1 according to aspect 4, characterized in that the reference oscillator arrangement 1 comprises a control device 20 for calibrating the first reference oscillator 2 to reduce or compensate for a frequency and/or phase difference between a frequency of the first output signal 3 of the first reference oscillator 3 and the external calibration signal 15;

preferably wherein the first reference oscillator 2 is tunable for this purpose, in particular wherein the first reference oscillator 2 is designed as a digital or analog frequency-tunable reference oscillator 2.

6. A reference oscillator arrangement 1 according to aspect 5, characterized in that the control means 20 is adapted to couple the calibration signal 15 to the phase locked loop 6, so that the phase locked loop 6 synchronizes the second reference oscillator 4 with the calibration signal 15.

7. Reference oscillator arrangement 1 according to aspect 5 or 6, characterized in that the control device 20 is designed to determine frequencies and/or phases of the external calibration signal 15 and the output signal 3 of the first reference oscillator 2 or of values or parameters corresponding thereto; and/or to minimize differences in frequency and/or phase between the calibration signal 15 and the first output signal 3 of the first reference oscillator 2 by calibrating the first reference oscillator 2.

8. Reference oscillator arrangement 1 according to aspect 7, characterized in that the control device 20 is configured to minimize a difference of a control quantity 13 of the phase-locked loop 6 with the calibration signal 15 coupled to the phase-locked loop 6 compared to the control quantity 13 with the first reference oscillator 2 coupled to the phase-locked loop 6 by calibrating the first reference oscillator 2, preferably wherein the reference oscillator arrangement 1 is adapted to determine the control quantity 13 with the calibration signal 15 coupled to the phase locked loop 6 and to tune the first reference oscillator 2 such that the control quantity 13 with the first reference oscillator 2 coupled to the phase locked loop 6 at least substantially corresponds to the control quantity 13 with the calibration signal 15 coupled to the phase locked loop 6.

9. Reference oscillator arrangement 1 according to any of aspects 4 to 8, characterized in that the reference oscillator arrangement 1 comprises a receiver for the calibration signal 15 based on a network protocol and/or a radio signal, preferably a radio time reference signal, in particular radio clock reference signal, and/or satellite navigation signal 17.

10. Reference oscillator arrangement 1 according to any of the preceding aspects, characterized in that the second reference oscillator 4 is coupled to a clock device 25 for providing a clock signal 29 derived from the second output signal 5 of the second reference oscillator 4, preferably wherein one or more clock signals 29 can be generated by the clock device 25 on the basis of the second output signal 5 of the second reference oscillator 4 by dividing the output signal 5 of the second reference oscillator 4.

11. Reference oscillator arrangement 1 according to one of the preceding aspects, characterized in that the reference oscillator arrangement 1 has a radar signal generator 35 for generating a radar signal 36, in particular FMCW frequency ramps, on the basis of the second output signal 5 of the second reference oscillator 4 and/or the clock signal 29 derived therefrom.

12. Radar system 45 having a plurality of reference oscillator arrangements 1, of which at least one reference oscillator arrangement 1 is designed according to one of the preceding aspects, and wherein the radar system 45 has a clock synchronization device 46 for synchronizing clock signals 29 of the reference oscillator arrangements 1 which can be generated by the reference oscillator arrangements 1, so that they provide mutually synchronized output signals 5, in particular frequency-synchronous and/or phase-synchronous output signals 5, and wherein the clock signal 29 which can be generated by the reference oscillator arrangement 1 according to one of the preceding aspects corresponds to the second output signal 5 or is derived therefrom.

13. Radar system according to aspect 12, characterized in that radar signals 36, preferably FMCW ramps, can each be generated synchronously with one another using the output signals 5.

14. Radar system according to aspect 12 or 13, characterized in that the radar system 45 comprises a plurality of radar receivers 33, each of which is operated with one of the synchronized output signals 5, so that a received signal 34 received or receivable by the respective radar receiver 33 is or is processed with the respective one of the synchronized output signals 5 by the respective radar receiver 33;

preferably wherein the radar system 45 comprises a radar transmitter 39 for emitting a radar signal 36 that is generatable based on one of the output signals 5, in particular wherein at least one of the radar receivers 33 is arranged or arrangeable at a position deviating from a position of the radar transmitter 39 and a reflection signal 47 of the radar signal 36 emitted by the radar transmitter 39 is receivable as a reception signal 34 by the radar receiver 33.

15. Synchronization method for radar systems 45, wherein a plurality of reference oscillator arrangements 1 are synchronized with one another, each having a first reference oscillator 2 and a second reference oscillator 4, wherein the first reference oscillator 2 in free-running mode preferably has a better frequency accuracy than the second reference oscillator 4, wherein the second reference oscillator 4 in free-running mode preferably has a lower phase noise than the first reference oscillator 2, and wherein the frequency and/or phase of the second reference oscillator 4 is controlled with a phase control loop 6 to the frequency and/or phase of the first reference oscillator 2 and the frequency and/or phase of the first reference oscillator 2 is calibrated on the basis of a calibration signal 15.

The various aspects of the present invention can be implemented individually and in various combinations, and each can provide, in particular, synergistic or combinatorial advantages, even if the particular combination is not explicitly described.

| | List of reference signs: |
|---|---|
| 1 | Reference oscillator arrangement |
| 2 | First reference oscillator |
| 3 | First output signal (first reference oscillator) |
| 4 | Second reference oscillator |
| 5 | Second output signal (second reference oscillator) |
| 6 | Phase locked loop |
| 7 | Feedback |
| 8 | Phase Frequency Detector |
| 9 | Feedback input |
| 10 | Reference input |
| 11 | PFD output signal |
| 12 | Loop filter |
| 13 | Control variable |
| 14 | Calibration input |
| 15 | Calibration signal |
| 16 | Calibration signal source |
| 17 | Satellite navigation signal |
| 18 | Multiplexer |
| 19 | Further calibration signal/Time synchronization signal |
| 20 | Control device |
| 20A | Time base |
| 21 | Selection signal |
| 22 | Tuning signal |

-continued

List of reference signs:

| | |
|---|---|
| 23 | Frequency control device |
| 24 | Phase difference |
| 25 | Clock device |
| 26 | Reset signal |
| 27 | Reset input |
| 28 | Divider |
| 29 | Clock signal |
| 30 | Clock input |
| 31 | Transceiver |
| 32 | Radar device |
| 33 | Radar receiver |
| 34 | Received signal |
| 35 | Radar signal generator |
| 36 | Radar signal |
| 37 | Mixer |
| 38 | IF signal |
| 39 | Radar transmitter |
| 40 | Transmit signal |
| 41 | Antenna |
| 42 | Control signal |
| 43 | Control input |
| 44 | Radar module |
| 45 | Radar system |
| 46 | Clock synchronization device |
| 47 | Reflection signal |
| 48 | Object |
| 49 | Signal processing device |
| FB | Filter bandwidth |
| $f(5)$ | Frequency of the second output signal |
| $f(3)$ | Frequency of the first output signal |
| $P_0$ | Output power (carrier) |
| $P(3)_{dB}$ | spectral power density of the first output signal |
| $P(5)_{dB}$ | spectral power density of the second output signal |
| $P_{N,5}$ | Phase noise level of the second reference oscillator |
| $P_{N,3}$ | Phase noise level of the first reference oscillator |
| t | Time |
| $U_3$ | Voltage of the first output signal |
| $U_{13}$ | Voltage of the control variable |
| $U_{15}$ | Voltage of the calibration signal |
| $U_{21}$ | Voltage of the selection signal |
| $U_{22}$ | Voltage of the tuning signal |

The invention claimed is:

1. A reference oscillator arrangement, comprising:
a first reference oscillator configured to generate a first output signal,
a second reference oscillator configured to generate a second output signal,
a phase-locked loop configured to control the frequency of the second reference oscillator to the frequency of the first reference oscillator and/or configured to control the phase of the second reference oscillator to the phase of the first reference oscillator,
a control input for an external calibration signal,
the reference oscillator arrangement configured to match the frequency and/or phase of the first reference oscillator to the external calibration signal, and
a control unit configured to couple the calibration signal to the phase locked loop so that the phase locked loop synchronizes the second reference oscillator with the calibration signal.

2. The reference oscillator arrangement according to claim 1, wherein the second reference oscillator is a quartz oscillator.

3. The reference oscillator arrangement according to claim 2, wherein the first reference oscillator is a temperature-compensated quartz oscillator.

4. The reference oscillator arrangement according to claim 1, wherein the first reference oscillator has a better frequency stability in free-running mode than the second reference oscillator, and the second reference oscillator has a lower phase noise in free-running mode than the first reference oscillator.

5. The reference oscillator arrangement according to claim 1, wherein the frequency and/or phase of at least the second reference oscillator can be tuned, and the phase-locked loop tunes the frequency of the second reference oscillator to the frequency of the first reference oscillator and/or the phase of the second reference oscillator to the phase of the first reference oscillator.

6. The reference oscillator arrangement according to claim 1, wherein the reference oscillator arrangement comprises a control device configured to calibrate the first reference oscillator to reduce or compensate for a frequency difference between a frequency of the first output signal of the first reference oscillator and the external calibration signal and/or to reduce or compensate for a phase difference between a phase of the first output signal of the first reference oscillator and the external calibration signal.

7. The reference oscillator arrangement according to claim 6, wherein the first reference oscillator is tunable for reducing or compensating a frequency difference between a frequency of the first output signal of the first reference oscillator and the external calibration signal and/or for reducing or compensating a phase difference between a phase of the first output signal of the first reference oscillator and the external calibration signal.

8. The reference oscillator arrangement of claim 6, wherein the control device is designed to minimize differences in frequency and/or phase between the calibration signal and the first output signal of the first reference oscillator by calibrating the first reference oscillator.

9. The reference oscillator arrangement according to claim 8, wherein the control device is designed to minimize a difference of a control variable of the phase-locked loop when the calibration signal is coupled to the phase-locked loop compared to the control variable when the first reference oscillator is coupled to the phase-locked loop by calibrating the first reference oscillator.

10. The reference oscillator arrangement according to claim 9, wherein the reference oscillator arrangement is configured to determine the control variable when the calibration signal is coupled to the phase-locked loop and to tune the first reference oscillator such that the control variable with the first reference oscillator coupled to the phase-locked loop corresponds or complies at least substantially to the control variable with the calibration signal coupled to the phase-locked loop.

11. The reference oscillator arrangement according to claim 1, wherein the reference oscillator arrangement comprises a receiver for the calibration signal based on a network protocol, a radio signal, a radio time reference signal, a radio clock reference signal, or satellite navigation signal.

12. The reference oscillator arrangement according to claim 1, wherein the second reference oscillator is coupled to a clock which is configured to provide a clock signal derived from the second output signal of the second reference oscillator.

13. The reference oscillator arrangement according to claim 1, wherein the reference oscillator arrangement has a radar signal generator configured to generate a radar signal or FMCW frequency ramps, on the basis of the second output signal of the second reference oscillator or a clock signal derived therefrom.

14. The reference oscillator arrangement according to claim 13, wherein the radar signal generator comprises an oscillator and a phase-locked loop configured to control the oscillator of the radar signal generator to lock on the second output signal of the second reference oscillator or to the clock signal derived therefrom.

15. A radar system comprising:
    a plurality of reference oscillator arrangements configured to provide synchronized output signals, respectively,
    a clock synchronization device configured to synchronize clock signals generated by the reference oscillator arrangements, so that these provide synchronized output signals, frequency-synchronous output signals or phase-synchronous output signals, wherein respective clock signals which can be generated by the reference oscillator arrangement correspond to the output signal or is derived therefrom,
    wherein a first one of the reference oscillator arrangements comprises;
    a first reference oscillator configured to generate a first output signal,
    a second reference oscillator configured to generate a second output signal,
    a phase-locked loop configured to lock the frequency of the second reference oscillator to the frequency of the first reference oscillator or to lock the phase of the second reference oscillator to the phase of the first reference oscillator, and
    wherein the first reference oscillator has a better frequency stability in free-running mode than the second reference oscillator and the second reference oscillator has a lower phase noise in free-running mode than the first reference oscillator, and
    wherein the clock signal which can be generated by the first reference oscillator arrangement corresponds to the second output signal or is derived therefrom.

16. The radar system according to claim 15, wherein the first reference oscillator arrangement has a control input for the external calibration signal by means of which the calibration signal is coupled to the phase locked loop so that the phase locked loop synchronizes the second reference oscillator with the calibration signal.

17. The radar system according to claim 15, wherein the radar system comprises a plurality of radar receivers, each of which is operated with one of the synchronized output signals or clock signals derived therefrom, so that a received signal received or receivable by the respective radar receiver is or can be processed with the respective one of the synchronized output signals by the respective radar receiver.

18. A synchronization method for radar systems, comprising:
    synchronizing a plurality of reference oscillator arrangements with one another, each having a first reference oscillator and a second reference oscillator, the first reference oscillator having a better frequency stability in free-running mode than the second reference oscillator and the second reference oscillator having a lower phase noise in free-running mode than the first reference oscillator,
    controlling the frequency of the second reference oscillator to the frequency of the first reference oscillator a phase-locked loop or controlling the phase of the second reference oscillator to the phase of the first reference oscillator by a phase-locked loop, and
    coupling a calibration signal to the phase locked loop, thereby synchronizing the second reference oscillator with the calibration signal, and
    matching the frequency or phase of the first reference oscillator to the calibration signal.

* * * * *